(12) United States Patent
Miller et al.

(10) Patent No.: US 6,197,604 B1
(45) Date of Patent: Mar. 6, 2001

(54) METHOD FOR PROVIDING COOPERATIVE RUN-TO-RUN CONTROL FOR MULTI-PRODUCT AND MULTI-PROCESS SEMICONDUCTOR FABRICATION

(75) Inventors: Michael Lee Miller, Cedar Park; William Jarrett Campbell, Austin, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/164,823

(22) Filed: Oct. 1, 1998

(51) Int. Cl.[7] .............................. G01R 31/26; H01L 21/66

(52) U.S. Cl. .................................. 438/14; 438/5; 395/362

(58) Field of Search ............................ 438/14, 5; 395/362

(56) References Cited

U.S. PATENT DOCUMENTS

| | | | |
|---|---|---|---|
| 4,500,408 | * 2/1985 | Boys et al. | 204/298 |
| 5,519,605 | 5/1996 | Cawlfield . | |
| 5,609,136 | 3/1997 | Tuken . | |
| 5,664,066 | * 9/1997 | Sun et al. | 395/23 |
| 5,740,033 | 4/1998 | Wassick et al. . | |

OTHER PUBLICATIONS

Spanos, et al., "A Multistep Supervisory Controller for Photolithographic Operations", Process Control, Diagnositcs, and Modeling In Semiconductor Manufacturing, 95(2): 1–17 (1995).*

Baras, J. et al., "A Framework for Robust Run by Run Control with Lot Delayed Measurements", *IEEE Transactions on Semiconductor Manufacturing*, 10(1):75–83 (Feb. 1997).

Butler, S. et al., "Supervisory Run–to–Run Control of Polysilicon Gate Etch Using In Situ Ellipsometry", *IEEE Tranmsactions on Semiconductor Manufacturing*, 7(2):198–201 (May 1994).

Drew, M. et al., "Automation and control for 300–mm process tools" *Solid State Technology, Worldwide Semiconductor Production*, 40(1) : 51–64 (Jan. 1997).

Hankinson, M. et al., "Integrated Real–Time and Run–to–Run Control of Etch Depth in Reactive Ion Etching", *IEEE Transacations on Semiconductor Manufacturing*, 10(1):121–130 (Feb. 1997).

Leang, S. et al., "Statistically Based Feedback Control of Photoresist Application", *IEEE/SEMI Advanced Semiconductor Manufacturing Conference and Workshop*, pp. 185–190 (Oct. 21–23, 1991).

Leang, S. et al., "Application of Feed–Forward Control to a Lithography Stepper", *IEEE/SEMI International Semiconductor Manufacturing Science Symposium*, pp. 79–84 (Jun. 15–16, 1992).

(List continued on next page.)

Primary Examiner—John F. Niebling
Assistant Examiner—Jonathan Hack
(74) Attorney, Agent, or Firm—Williams, Morgan & Amerson

(57) ABSTRACT

A system and method of controlling multi-process, multi-product semiconductor fabrication tools. Individual, grouped, or composite controllers are designated to control various tool operations. First control parameters for a fabrication tool process are generated, where the first control parameters are based on first tool operation attributes. Second control parameters for the process are generated based on second tool operation attributes. The fabrication tool is then controlled by generating cooperative control parameters which are a function of the first and second control parameters. Disturbance information can be shared between controllers for use in generating the first and second control parameters while taking into account disturbance information already discovered and quantified.

20 Claims, 8 Drawing Sheets

Mozumder P. et al., "Statistical Feedback Control of a Plasma Etch Process", *IEEE Transacations on Semiconductur Manufacturing*, 7(1) :1–11 (Feb. 1994).

Spanos, et al., "A Multistep Supervisory Controller for Photolithographic Operations", *Process Control, Diagnostics, and modeling in Semiconductor Manufacturing*, 95(2):1–17 (1995).

Telfeyan, R. et al., "Demonstration of a Process–Independent Run–to–Run Controller", Proceedings of the Symposium on Process Control, Diagnostics, and Modeling in Semiconductor Manufacturing, Electrochemical Society Proceedings, 95(4):48–60) (1995).

Zafiriou E. et al., "Nonlinear Model Based Run–To–Run Control for Rapid Thermal Processing with Unmeasured Variable Estimation", Proceedings of the Symposium on Process Control, Diagnostics, and Modeling in Semiconductur Manufacturing, (pp. 18–31) (1995).

* cited by examiner

METHOD FOR PROVIDING COOPERATIVE RUN-TO-RUN CONTROL FOR MULTI-PRODUCT AND MULTI-PROCESS SEMICONDUCTOR FABRICATION

FIELD OF THE INVENTION

The present invention relates generally to the manufacture of semiconductor wafers and, more specifically, to a system and method for cooperatively controlling the operations associated with various processes and products to be run on a semiconductor fabrication tool.

BACKGROUND OF THE INVENTION

In recent years, the control of semiconductor processes has evolved to include an approach referred to as run-to-run (RtR) control. RtR control is a type of supervisory-level control that uses in-line measurements to adjust the recipe used on a process tool. The recipe adjustments are typically made on a lot-to-lot, wafer-to-wafer, or batch-to-batch basis to compensate for drifting tool qualities or changes in incoming wafer conditions. The in-line measurements are made after the process begins being controlled in the case of feedback control, or before the process in the case of feedforward control.

While RtR controllers have been applied or proposed for various fabrication processes, one important issue that affects deployment of RtR control has largely been ignored. In many state-of-the-art fabs, costly fab tools are required to run more than one process for throughput and flexibility reasons. Furthermore, such fabs often produce more than one type of chip. Multi-process and multi-product considerations can lead to difficulties when designing and deploying a RtR controller.

Many conventional RtR controllers have been concerned with the control of a single product type going through one process. However, most applications in an operable state-of-the-art fab will be faced with many products and product types. For example, along with the fab's principal product, test chips and secondary products are typically produced as well. Further, in order to improve the flexibility of the fab and reduce tool costs, multiple processes may be run on the same tool. A tool may therefore be required to manage multiple products using one process, multiple processes for a given product, and/or multiple processes and multiple products. These potentially diverse circumstances can lead to complications in RtR control practice.

An example of a single-process, multiple product fab tool might be a poly gate etch tool. Poly gate etch involves the smallest linewidth dimensions on the chip, and as such usually presents a difficult control problem. Since poly gate etch is a process used in the manufacture of most semiconductor chips, all of the products manufactured in a fab will have to go through the process. However, as it is such a critical process and is often difficult to control, many fabs dedicate equipment to this process. While this may involve only a single process, RtR control for such a tool still requires consideration for multiple products.

On the other hand, some fabs are dedicated to only one product. This is common in the manufacture of memory chips, where high volumes of a single type of chip are commonplace. In these fabs, the issue of controlling multiple products through a process tool may not surface. However, in smaller fabs where tools cannot be dedicated to a particular process, a RtR control system must be able to comprehend these multiple processes and be able to effectively control them.

The most complex case for a RtR controller is that of multiple processes and multiple products running on the same process tool. An example of this is Chemical-Mechanical Polish (CMP) of interlayer dielectric (ILD) layers. Multiple ILD layers are typical in microprocessors, and the use of CMP to planarize the ILD layers is becoming more and more common. Generally, CMP utilizes an abrasive slurry disbursed in an alkaline or acidic solution to planarize the surface of the wafer through a combination of mechanical and chemical action. A typical chemical mechanical polishing tool includes a rotatable circular platen or table on which a polishing pad is mounted and a polishing device is positioned above the pad. The polishing device includes one or more rotating carrier heads to which wafers can be secured typically through the use of vacuum pressure. In use, the platen is rotated and an abrasive slurry is disbursed onto the polishing pad. Once the slurry has been applied to the polishing pad, a downforce is applied to each rotating carrier head to press its wafer against the polishing pad. As the wafer is pressed against the polishing pad, the surface of the wafer is mechanically and chemically polished. These polish operations are often similar, which allows for CMP tools to switch between them. However, they are not identical, and changes in wafer topography and target thickness result in differences in the processes.

Accordingly, there is a need for a control technique capable of facilitating multi-product and multi-process runs in semiconductor fabrication systems, and for reducing tool costs and improving the flexibility of the fab. The present invention provides a solution to the aforementioned and other shortcomings of the prior art, and provides advantages over existing run-to-run control methodologies.

SUMMARY OF THE INVENTION

The present invention provides a system and method of controlling semiconductor fabrication tools by designating individual, grouped, or composite controllers to control various tool operations. Control parameters from predetermined combinations of the individual, grouped or composite controllers are used to provide cooperative control parameters, which are generated as a function of the individual, grouped or composite control parameters. Disturbance information can be shared with other controllers to alleviate the need for each controller to independently generate the disturbance information where its corresponding process is affected by the disturbance information.

In accordance with one embodiment of the invention, a method for providing multi-process and multi-product run-to-run control of a semiconductor fabrication tool is provided. First control parameters for a fabrication tool process are generated, where the first control parameters are based on first tool operation attributes. Second control parameters for the process are generated based on second tool operation attributes. The fabrication tool is then controlled by generating cooperative control parameters which are a function of the first and second control parameters. Disturbance information can be shared between controllers for use in generating the first and second control parameters while taking into account disturbance information already discovered and quantified.

In accordance with another embodiment of the invention, a method for providing multi-process and multi-product run-to-run control of a semiconductor fabrication tool is provided. First tool operations are individually controlled based on individual attributes of the first tool operations. Each of the remaining tool operations are collectively controlled by a unitary group controller that provides a common control signal to each of the remaining tool operations of a group. The common control signal is based on group attributes common to each of the second tool operations. Disturbance information for each of the tool operations is determined and shared with any of the other tool operation controllers. The individual and collective control is adjusted in response to the shared disturbance information.

In accordance with another aspect of the invention, a cooperative control apparatus for controlling semiconductor manufacturing tool processes is provided. The cooperative control apparatus includes at least one independent controller coupled to the semiconductor manufacturing tool to generate individual control parameters for each of the tool processes. One or more group controllers are coupled to the semiconductor manufacturing tool to generate collective control parameters for each of the tool processes of a corresponding group of tool processes. A cooperative controller is coupled to receive the individual control parameters and the collective control parameters associated with each of the tool processes, in order to provide a cooperative control parameter for each of the tool processes. Each of the cooperative control parameters is a function of its corresponding individual and collective control parameters.

In accordance with another aspect of the invention, a system for manufacturing semiconductor wafer devices is provided, where the system includes a semiconductor fabrication tool capable of performing multiple manufacturing operations on the wafer devices. The system also includes at least one in-line measurement module to determine one or more attributes corresponding to a process or product of the semiconductor fabrication tool. A control module is coupled to the inline measurement module to receive the process/product attributes. The control module is also coupled to provide control parameters to the semiconductor fab tool based on a state of the process/product attributes. The control module includes at least one independent controller coupled to the semiconductor manufacturing tool to generate individual control parameters for each of the tool processes. One or more group controllers are coupled to the semiconductor manufacturing tool to generate collective control parameters for each of the tool processes of a corresponding group of tool processes. A cooperative controller is coupled to receive the individual control parameters and the collective control parameters associated with each of the tool processes, in order to provide a cooperative control parameter for each of the tool processes. Each of the cooperative control parameters is a function of its corresponding individual and collective control parameters.

The above summary of the present invention is not intended to describe each illustrated embodiment or implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
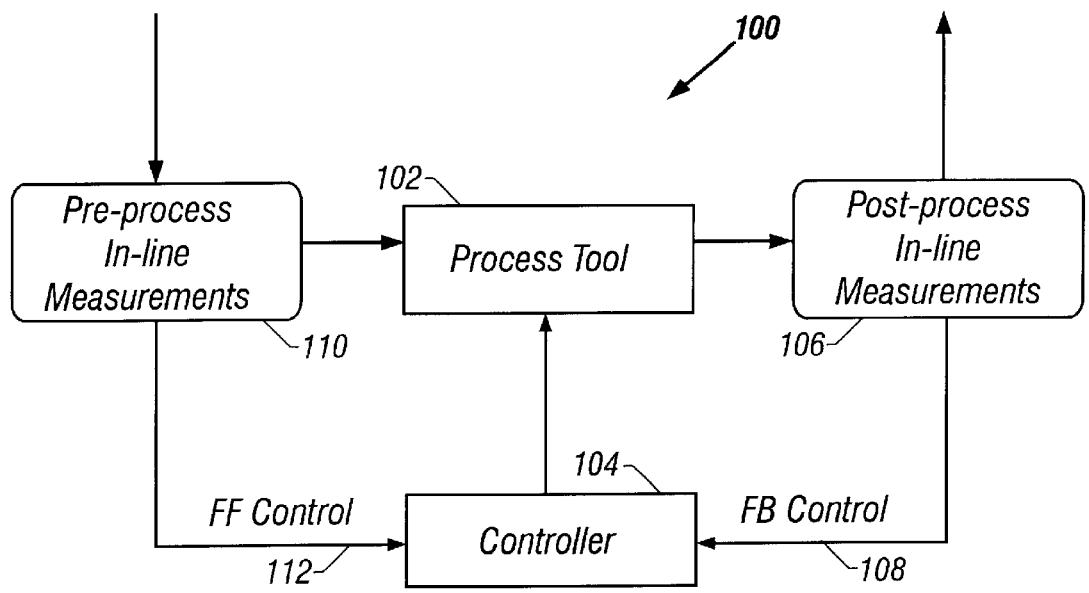
FIG. 1 is a block diagram of a controlled semiconductor fabrication environment in accordance with one embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention generally provides a system and method for controlling semiconductor manufacturing tools. The invention, in particular, provides techniques for designating individual, grouped, or composite controllers to control various tool operations in a logical and efficient manner. Further, control parameters associated with predetermined individual, grouped, or composite controllers can be shared with other controllers. In this manner, other controllers can exploit the efforts already undertaken by other controllers, which minimizes the need for controllers to continually discover the same disturbances and regenerate the same controller adjustments. This provides for a very effective control mechanism, capable of controlling the tool such that multiple products and multiple processes can be completely operable on a common fabrication tool. A more thorough understanding of the invention will be achieved by reading the detailed description which follows.

FIG. 1 is a block diagram of a controlled semiconductor fabrication environment 100 in accordance with one embodiment of the present invention. The process tool 102 receives wafers, carries out the particular process(es) defined for the process tool according to input control parameters received from the controller 104, and outputs processed wafers. The process tool 102 can represent tools related to a wide variety of processes, including, but not limited to, deposition thickness and rate control, etch depth and linewidth control, photoresist application control, photolithography linewidth control, rapid thermal processing control, and control of CMP. The controller of the present invention may be implemented using, for example, MatLab Optimization Toolbox® routines. The controller 104 may be interfaced with the polish tool 102 using, for example, an Advance Process Control Framework interface.

Post-process in-line measurements are made after execution of the process, as illustrated at block 106. Post-process measurements provide "feedback control" depicted on feedback (FB) path 108. Alternatively, pre-process in-line measurements, shown at block 110, are made prior to process control. These attributes are provided as "feedforward control" as shown on feedforward (FF) path 112.

A particular process tool 102 may be required to perform a variety of processes, each of which may be applied to differing products. The controller 104 must be able to accommodate the various processes carried out by the process tool 102 for each of the different products and types of products being subjected to the process. The present invention provides such a controller methodology.

Figure 2:
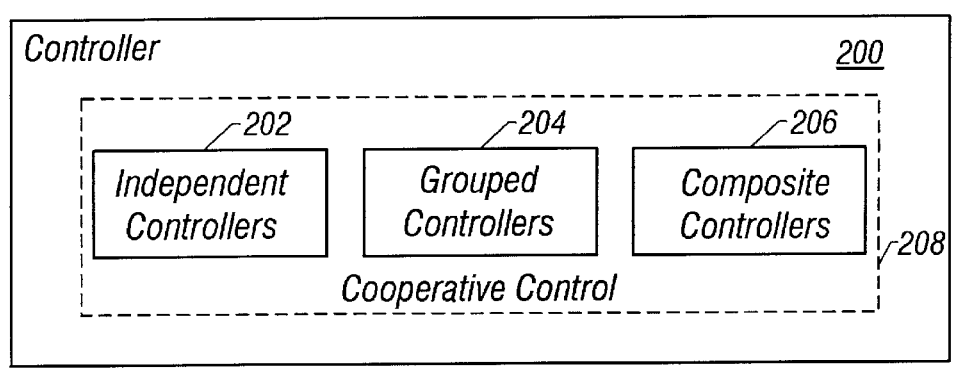
FIG. 2 is a block diagram illustrating one manner in which multi-process and multi-product run-to-run control is realized in accordance with the present invention.

FIG. 2 is a block diagram illustrating one manner in which multi-process and multi-product RtR control is realized in accordance with the present invention. The controller 200 provides a comprehensive control strategy to facilitate effective control of fabrication tools that must adapt to changing processes and product variation. The controller 200 includes a combination of one or more independent controllers 202, grouped controllers 204, and/or composite controllers 206. Each of the control segments 202, 204, 206, either independently or in combination, may be subject to a cooperative control 208 arrangement and methodology that allows certain control information to be shared by the control segments of the controller 200. The cooperative control methodology, including selective control organization and selectively-shared control parameters, provides a robust, yet flexible control system capable of controlling process tools encountering multi-product and multi-process situations.

The different groupings of controllers includes independent controllers 202. Generally, an independent controller independently and separately controls each combination of product and process. No information is shared, and each product or process is handled independently of the rest. Grouped controllers 204 refers to grouping certain products or processes for purposes of control. For example, two particular products may be similar enough that they can be treated as a common product. The grouped products are then aggregately controlled as a group, which reduces the number of independent controllers required. Composite control 206 is an extreme case of grouping such that all processes or products are grouped together for purposes of a certain control parameter, so that the number of independent controllers is reduced to one for that process or product. Further, it is sometimes possible to design controllers that share information. This type of control, referred to as cooperative control 208, has advantages above and beyond the control system to which it is applied. Independent, grouped, composite and cooperative control is described in greater detail below.

An important factor to consider in determining which control approach to use for a particular application is the type of disturbances that can affect the process. Whether or not a particular disturbance affects the tool has a great impact on the design of the control system, since such disturbances will have a varying effect on some or all the products and processes going through the tool.

Tool-based disturbances can affect all wafers processed by the tool. Examples of tool-based disturbances include internal sensor calibrations, chamber conditions, and polish pad changes. Tool control based on tool-based disturbances is a prime candidate for the implementation of cooperative control 208, since a change to a new tool process or the change in incoming product is likely to be present both before and after these process/product changes. In these cases, it is highly desirable to store the disturbance information for use by all processes and products of the tool, since the disturbance is inherent to the tool. This disturbance information sharing enhances the quality of subsequent processes and products.

Other disturbances can appear across different products and processes, such as disturbances in raw materials. For example, changes in the characteristics of a resist will affect all products, regardless of the specific process used. Again, such a disturbance is amenable to cooperative, grouped control. On the other hand, disturbances independent of the tool should be identified so that all processes and products are not subjected to an inapplicable compensation factor. For example, disturbances can enter the system by way of the incoming wafers which are specific to those wafers, and should not be allowed to affect subsequent material going through the system. Examples include ILD thickness and uniformity of wafers entering a CMP, resist thickness and uniformity going into lithography, resist linewidth entering etch processes, and the like. These types of disturbances are receptive to feedforward control which enhances the ability of the controller to handle multiple products. This disturbance information can be stored and shared so that subsequent products entering the tool are not subject to the product-specific control parameters.

The invention provides a control structure capable of cooperatively sharing information within and across the different grouping boundaries. In order to fully appreciate the organizational control arrangement, each of the control methodologies are described below. For purposes of illustration and not of limitation, much of the following description is presented in connection with a Chemical-Mechanical Polish (CMP) tool in order to provide representative examples of the principals of the invention. It should be recognized that the invention is analogously applicable in connection with other process tools.

Independent controllers can be used under circumstances where the processes and products involved are too dissimilar to collectively control. In these cases, it is sometimes necessary to have a controller dedicated to each combination of process and product. There are both advantages and disadvantages to employing a controller per process/product pair. One disadvantage is the management of a potentially large number of controllers, each with perhaps different control structures, control parameters, and process models. With this type of control system, controller management can be prohibitively difficult without a flexible infrastructure in which to execute them.

Figure 3:
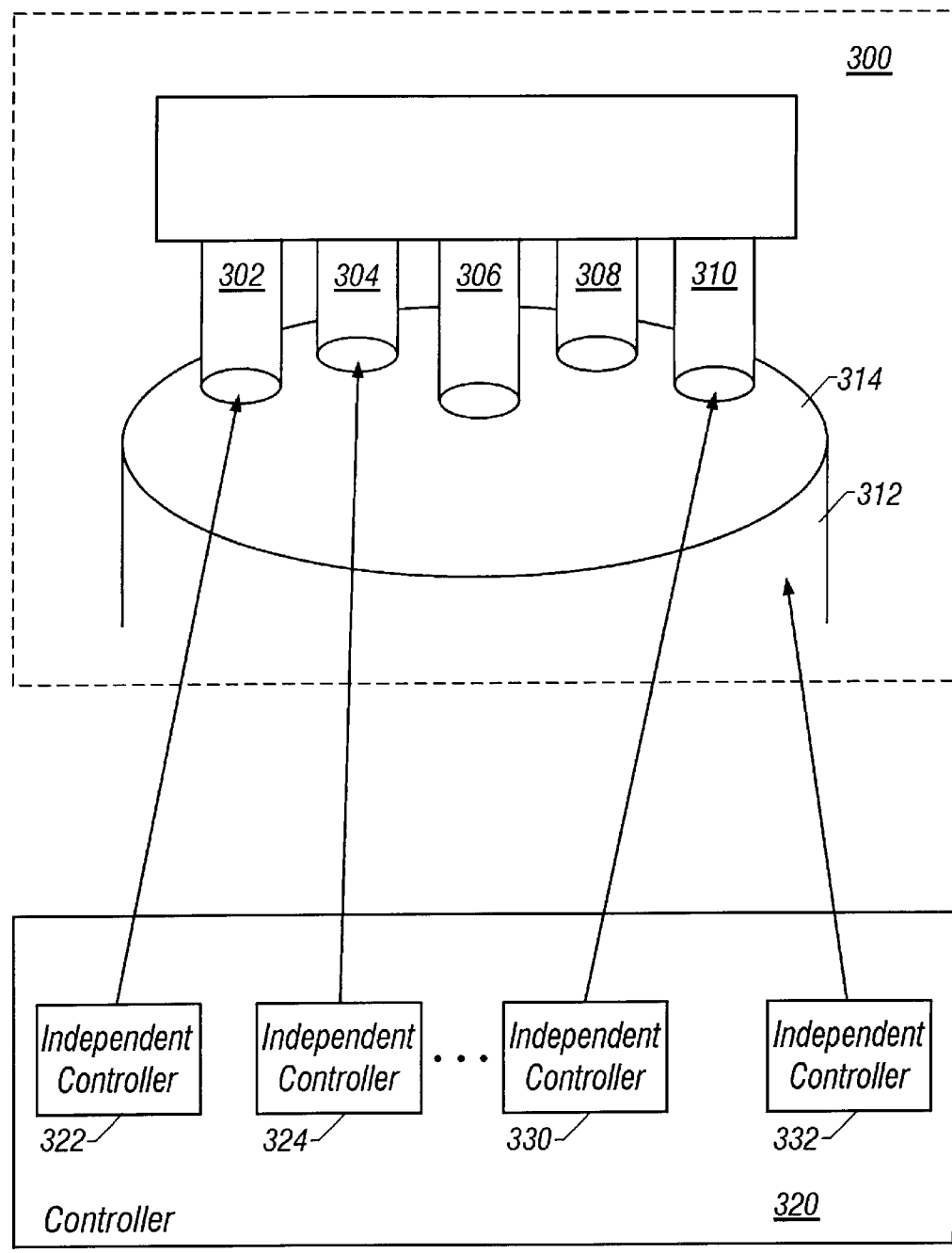
FIG. 3 is a block diagram of a process tool performing a chemical-mechanical polishing operation using independent control techniques.

An example of independent control is provided in FIG. 3. In this example, the process tool 300 performs chemical-mechanical polishing of multiple wafers using multiple polishing arms 302, 304, 306, 308 and 310. The CMP process tool 300 includes a rotatable circular platen 312 or table on which a polishing pad 314 is mounted. The polishing arms includes one a rotating carrier head 314 to which wafers can be secured typically through the use of vacuum pressure. In use, the platen is rotated and an abrasive slurry is disbursed onto the polishing pad. Once the slurry has been applied to the polishing pad 314, a downforce is applied to each rotating carrier head to press its associated wafer against the polishing pad 314. As the wafer is pressed against the polishing pad 314, the surface of the wafer is mechanically and chemically polished. In the case of independent control, each of the polishing arms is controlled by a distinct, independent controller that is part of the overall controller 320. For example, independent controllers 322, 324 through 330 independently control polishing arms 302, 304 through 310 respectively. Similarly, independent controller 332 can be used to independently control the platen 312.

Despite some of their disadvantages, multiple independent controllers have the capability of being designed and tuned independently. Each controller can be the "optimal" controller for the process and product being controlled. Because each controller is independent of the rest of the controllers, variability in the incoming quality of one product will not adversely affect other products being controlled. In a pure feedback RtR controller, a change in incoming ILD thickness to a polish operation, for example, will result in adjustments to the polish recipe used in subsequent lots. In this case, however, only the recipe for a single process and product will be changed; the disturbance will not impact other processes or products.

While the independence of the controllers has advantages for disturbances in incoming wafer quality, it has disadvantages when there are disturbances in the process tool. As mentioned previously, these disturbances can affect all of the processes or products run on the tool. Since each controller is independent of the others, each must compensate for the disturbance individually. As the tool switches from one product or process to another, the disturbance is re-introduced to the system, resulting in wafers produced off-target. In addition, the disturbance can be more drastic after a switch than as it originally appeared. Take, for example, the case illustrated in FIG. 4.

Figure 4:
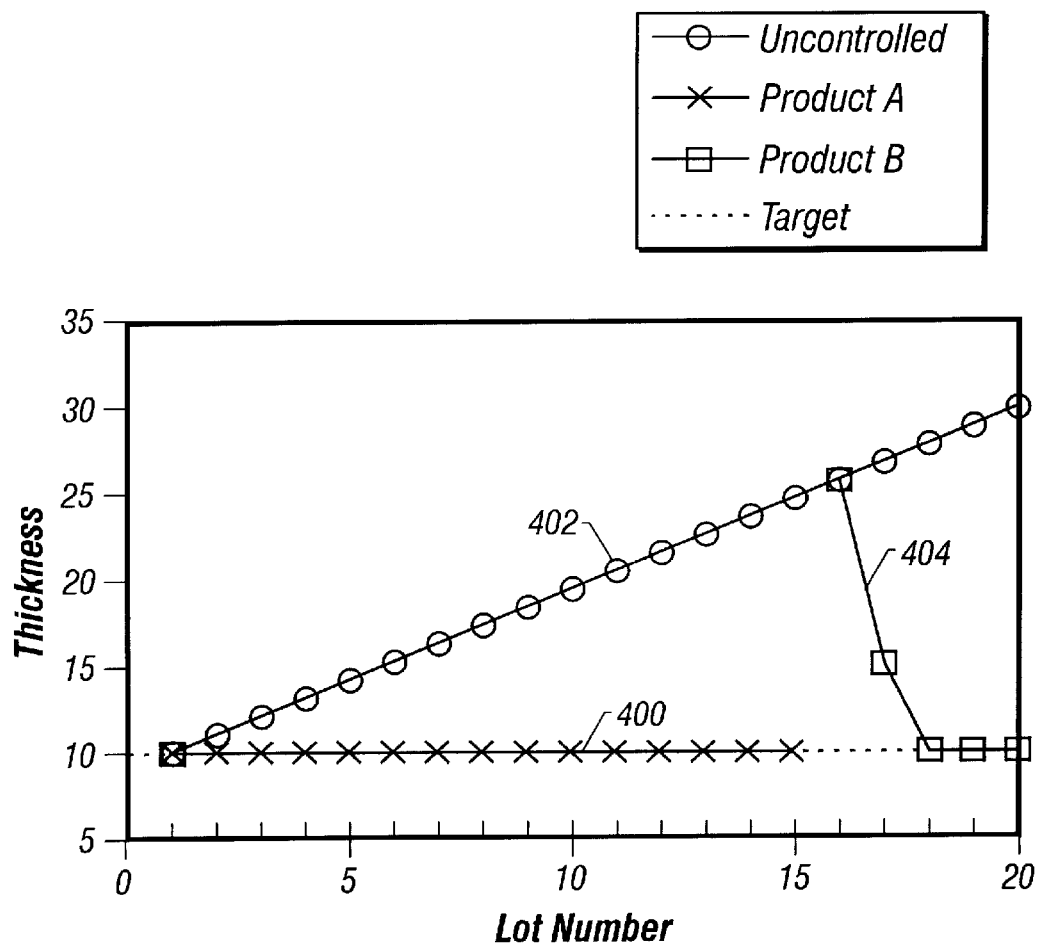
FIG. 4 is a graph illustrating how disturbances can affect two different products run on the same fabrication tool.

The example of FIG. 4 represents two different products being polished on the same CMP tool. First, a series of product "A" lots are polished under the control of a first independent controller, represented by line 400 held to thickness value 10. Then, the tool switches to product "B". Due to a gradual degradation in the quality of the polishing pad represented by line 402, the independent controller for product "A" made gradual changes in the polish recipe in order to keep the post-polish thickness on target. Suppose that this gradual polish pad wear is exactly the disturbance for which the controllers were designed, such that the "A" controller is able to keep the thickness on target. However, when the tool switches to product "B" and the "B" controller assumes control, all of the gradual adjustments to the process recipe made by the "A" controller are disregarded. To the "B" controller, what was a gradually increasing disturbance now has the appearance of a more drastic step disturbance. Therefore, the first lot of product "B" is far off target, and since the controllers were designed for gradual disturbance rejection, the "B" controller is unable to fully compensate for the disturbance until the third product "B" lot. This results in two off-target lots, as depicted by line 404.

One manner of improving the performance of the controller when these switches occur is through the use of test wafers. By running test wafers between the processing of these two products, the result can be used to evaluate the current state of the polish pad. This state information allows the "B" controller to compensate for the disturbance before the first "B" lot is processed. However, by adding test wafers, the control system increases product wafer costs (through increased test wafer costs) and decreases tool throughput. The cooperative control methodology of the present invention provides for the storage of the compensation factor used in connection with the "A" controller, so that the "B" controller can take advantage of what was learned by the "A" controller.

Grouping controllers represents another class of the control organization. Improved control system performance can be accomplished by reducing the number of switches between controllers. This can be accomplished by grouping some of the process/product pairs together. These groups are then controlled as if they were homogenous by one RtR controller per group. Switches from one process/product pair to another within the same group are ignored, so all members of a "group" need to be as similar as possible. Typically, different products running through the same process can be grouped together, provided that the products have the same process target. In some cases, different processes can even be grouped together. For example, in a 5-layer metal microprocessor design, some of the ILD layers may have the same thickness and uniformity specification. These similar ILD layers are candidates for grouping. However, in many cases choosing similar products or processes is difficult. Besides the process target, other factors that could be considered when grouping process/product pairs are the base recipe used, the physics involved, or the number of independent groups desired.

If test wafers are used when switches occur, grouping controllers together has the added benefit of reducing the test wafer usage. Grouping also has the advantage of reducing the controller parameters, models, and model parameters that have to be managed. Further, as described more fully below, grouping controllers can also benefit from the cooperative control methodology of the present invention.

Composite controllers represent yet another form of control in the control hierarchy. A composite controller is essentially where one composite RtR controller is used for all of the processes and products. The primary advantage in using a composite controller is that controller switching is eliminated. Since no controller switching occurs, there are no switching disturbances, and no need for either test wafers or cooperative controllers. However, composite control is not without its disadvantages. One disadvantage is the increased difficulty in developing a general model that encompasses all of the processes and products to be controlled. In some cases, it may not be possible to quantify certain characteristics of a product or process (e.g., topography effects), thus making it even more difficult to develop the model.

Even if a general model can be developed for a particular application, other challenges in forming a composite controller design exist. Since all of the processes and products are grouped together, the process target may not remain constant from one run to the next. This results in a controller that must be able to handle setpoint changes as well as disturbances. Typically, controllers that are designed and tuned for disturbances are not well suited for set point changes, and vice versa. The composite controller, however, needs to be able to both track setpoint changes and reject disturbances. It has exchanged switching disturbances for setpoint changes, and as a result may exhibit a reduction in controller performance.

In order to maximize efficiency and minimize the disadvantages of any one of the control types, the present invention includes a cooperative control scheme that can control various aspects of the process tool using a combination of the aforementioned control methodologies. Further, the present invention can utilize information from different products, rather than test wafers, to control a single tool. The cooperative control methodology described below provides further benefits to the control scheme by allowing information from a variety of products and processes to be shared among the various controllers and control groupings.

Figure 5:
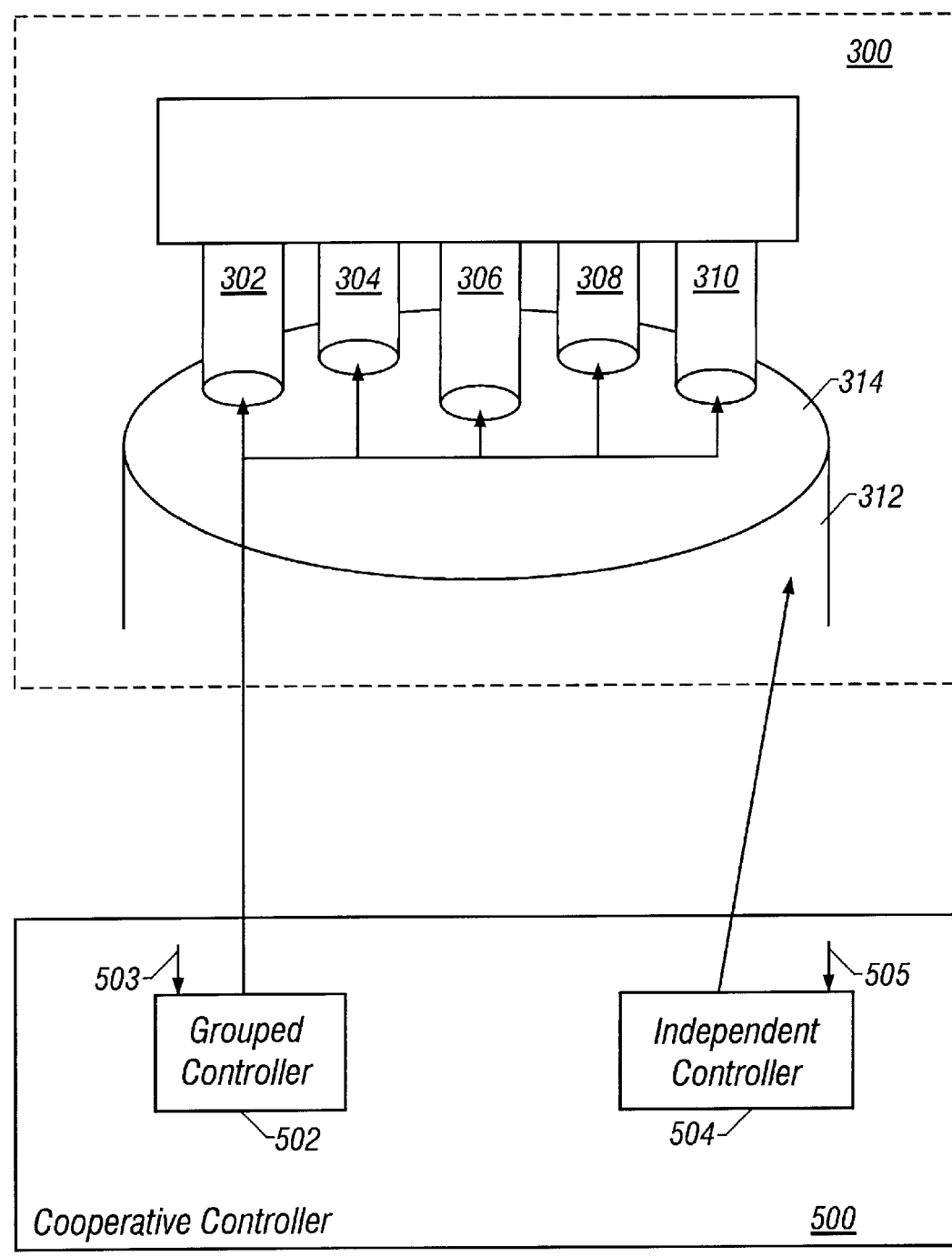
FIG. 5 illustrates one embodiment of a cooperative controller including independent and grouped controllers in accordance with the present invention.
Figure 6:
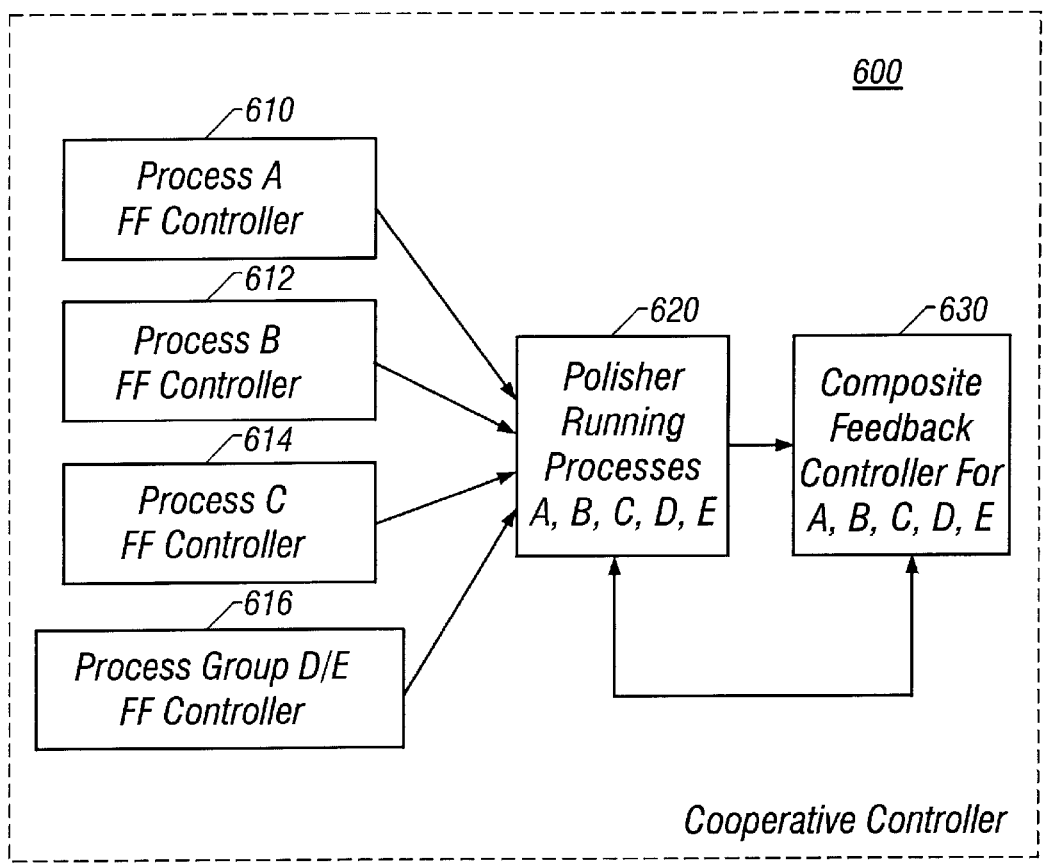
FIG. 6 illustrates another embodiment of a cooperative controller in accordance with the present invention.

An example of a cooperative controller including independent and grouped controllers is provided in FIG. 5. FIGS. 5 and 6 are described in the context of a CMP tooling environment to facilitate an understanding of the cooperative control concept, but the invention is clearly not limited to the examples depicted in FIGS. 5 and 6. However, analysis of the examples of FIGS. 5 and 6 provide an understanding of the cooperative control concept which can be analogously applied in other RtR control situations, as will be readily apparent to those skilled in the art from the following description.

In the example of FIG. 5, again the process tool 300 performs chemical-mechanical polishing of multiple wafers using multiple polishing arms 302, 304, 306, 308 and 310. However in this example, the cooperative controller 500 includes grouped controller 502 to control a certain group of the polishing arms. For example, feedforward or feedback information may be provided to the grouped controller 502 via path 503 from any one or more of the polishing arms 302, 304, 306, 308, 310. In one embodiment, one of the polishing arms can be representative of the feedforward or feedback information to the controller 502. In another embodiment, the group controller 502 receives information from all 5 polishing arms and makes a decision based on all of the information. The grouped controller 502 in turn controls all of the polishing arms as if they were a single polishing arm. In other words, a common controller output is provided by the controller 502 to each of the 5 polishing arms. This improves the control system performance by reducing the number of switches between controllers.

The cooperative controller 500 also includes an independent controller 504 in this example. The independent controller 504 provides independent control of the platen 312. The controller 504 can receive information on path 505 regarding the entire lot, and change the rotational speed of the platen in response thereto. Information can be shared between the grouped controller 502 and the independent controller 504 as necessary, and between each of these controllers and subsequent instances of grouped and independent control for subsequent processes and products. For example, where the independent controller 504 determines that corrective compensation is required to modify the rotational speed of the platen 312, the cooperative controller allows this corrective compensation factor to be used in connection with controllers of subsequent processes and lots that would otherwise need to discover the platen speed problem all over again.

FIG. 6 illustrates another example of the cooperative control concept according to the present invention. The cooperative controller 600 is a conglomeration of several different controllers 610, 612, 614, 616 and 630. The cooperative controller 600 is essentially wrapped around independent controllers 610, 612 and 614 which control process A, process B and process C respectively, grouped controller 616 which collectively controls processes D and E, and composite controller 630 which is a feedback controller for all processes A, B, C, D and E.

In operation, if, for example, process A is being run on polisher 620, an independent controller 610 makes an adjustment to the process based on process A only. Analogously, independent controllers 612 and 614 make adjustments to the process based on processes B and C respectively. A grouped controller 616 uses information common to processes D and E to collectively control processes D and E running on the tool 620. A feedback controller 630 also makes adjustments to processes A, B, C, D, E, regardless of other individual adjustments made by controllers 610, 612, 614 and 616.

The resulting control function of the cooperative controller 600 for each function therefore cooperatively utilizes the control parameters from more than one controller. For example, process A is cooperatively controlled by independent controller 610 and composite controller 630, process B is cooperatively controlled by independent controller 612 and composite controller 630, and so forth. Processes D and E are controlled by grouped controller 616 and composite controller 630. The cooperative control parameters from the cooperative controller 600 becomes a function of the various controllers affecting the particular process. For example, the composite controller 630 may determine that the platen is not rotating fast enough, which provides a composite controller adjustment output. The process A controller 610 may also determine that the corresponding polishing arm is not rotating fast enough. These two control parameters are both used to provide a cooperative control parameter for process A. In effect, the composite control information is shared with each of the independent and grouped controllers 610, 612, 614, 616 to allow the proper adjustments at these individual and grouped controllers, taking into account the composite controller's determination that the platen speed was not fast enough. This allows subsequent processes and products to benefit from the composite controller's discovery of a disturbance that will effect the subsequent processes and products.

Figure 7:
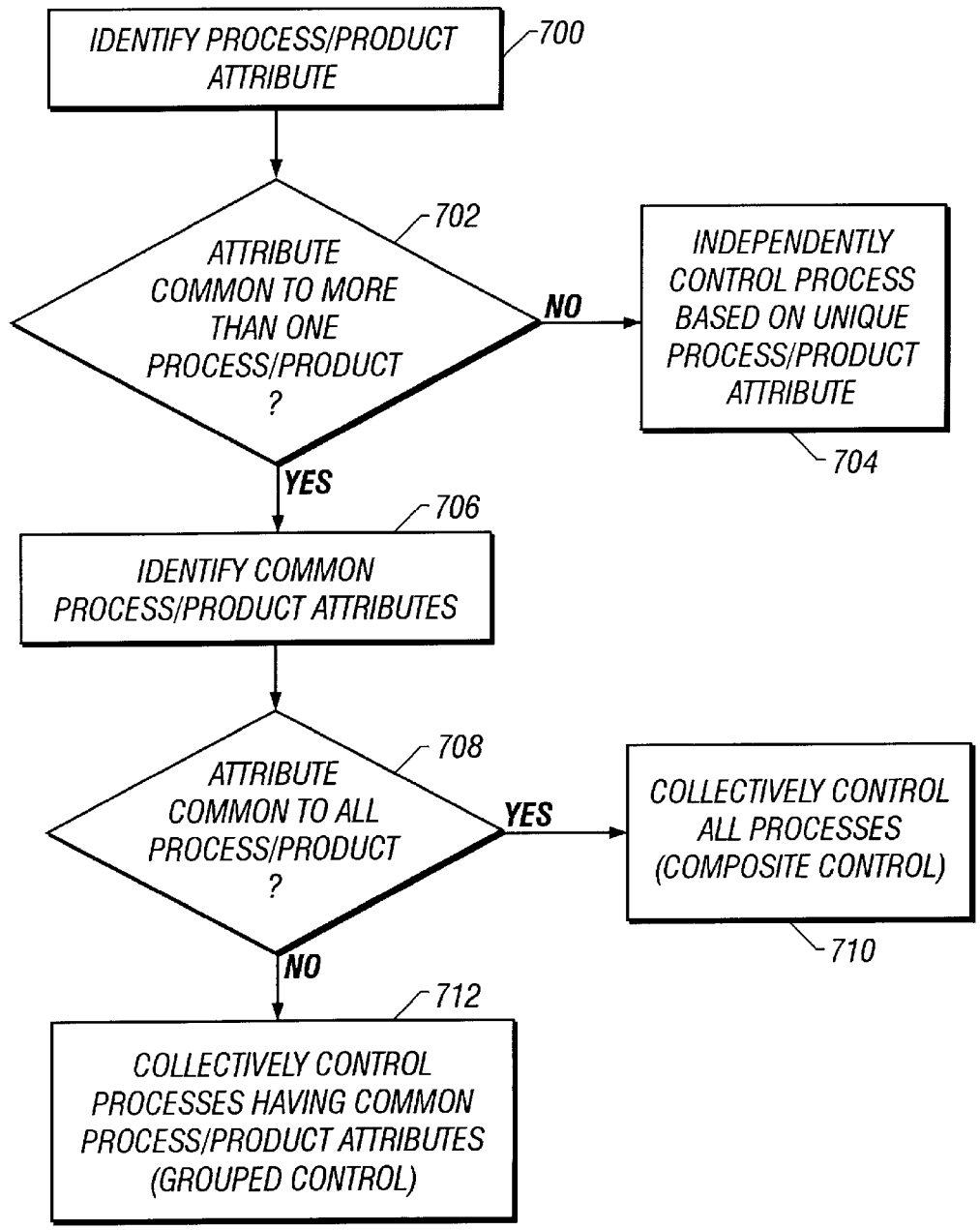
FIG. 7 is a flow diagram illustrating one embodiment of a controller grouping methodology in accordance with the present invention.

FIG. 7 is a flow diagram illustrating one embodiment of a controller grouping methodology in accordance with the present invention. For purposes of FIG. 7, a process/product attribute is a characteristic of a process, or of a combination of a process and product, that can be identified and accounted for by the controller. At block 700, a process/product attribute is identified. If the identified attribute is not common to more than one process/product as determined at block 702, the process is independently controlled 704, based on the unique process/product attribute. This is the case where an independent controller is used to control the process associated with that process/product attribute.

Where the attribute is common to more than one process/product, each of the common process/product attributes associated with a particular process are identified 706. If these common attributes are common to all of the processes as determined at block 708, all of the processes are collectively controlled, as previously described with respect to composite control. Where only some of processes have common attributes, those processes having common process/product attributes are collectively controlled as seen at block 712. This is the case of grouped control.

This type of control arrangement facilitates multi-product, multi-process control at the level that provides the most reasonable manufacturability solution. Each of the various control groupings therefore accommodates the various processes and products run on the tool, and groupings are made where like process or product parameters allow for it.

Perhaps the greatest disadvantage of the prior art in using more than one controller is when switching between these controllers. In the prior art, any "knowledge" that an independent controller gained about disturbances currently affecting the process is lost when the next controller takes over. This results in the switching disturbance previously illustrated in FIG. 4. However, if the controllers were able to share their "information" about the disturbances, the switch disturbance could be reduced, and perhaps eliminated. Before the individual controllers can share disturbance information, each must be able to qualify and quantify the disturbances. In particular, the controllers must be able to determine if the disturbance is associated with the tool or the wafers being processed, and estimate the magnitude of the disturbance. The distinction between tool base and incoming wafer disturbances is important because not all disturbance information should be shared between controllers. For instance, if the main disturbance affecting a process is a result of variations in incoming wafer quality, that disturbance information should not be passed on to another controller when a switch in products is made. This is because in most circumstances, incoming quality disturbances by their very nature are less likely to cross products. On the other hand, tool disturbances are much more likely to affect more than one product, and even more than one process. These are the types of disturbances that cause the switching effect illustrated earlier.

An important feature of the cooperative control system of the present invention is this ability to share information between the various independent and grouped controllers. Information, such as disturbance information, know by certain independent, grouped, or composite controllers can be shared with other controllers. Further, information can be shared with subsequently-activated controllers. An example is a controller associated with product B, which has different process requirements than the process requirements associated with product A. Where the controller associated with product A, whether independent or grouped, determines that an adjustment is necessary to account for a tool disturbance, this adjustment can be shared with the controller used to control product B when the product A run is complete. This cooperative characteristic of the present invention is an effective means for facilitating group control where necessary, as information from other controllers can provide sufficient information to identify certain problems, such as those associated with the tool itself. The cooperative characteristic also reduces or eliminates the need to use test wafers while operating under RtR control.

To design a cooperative controller in accordance with the present invention, the disturbances must be analyzed and quantified. In addition to their use in feedforward control, available measurements of incoming wafer quality can be used to determine if a disturbance is tool-related or not. The lack of variability in incoming wafer quality is no guarantee that the disturbance is tool-related, and any recipe adjustment made based on these measurements should not be carried over to the new controller upon a switch, unless that same disturbance is in the incoming quality of the new product.

Beyond feedforward measurements, in-line post-process measurements may also be used to qualify and quantify disturbances. The type, frequency, and quality of the measurements all play a role in the usefulness of post-process measurements. One factor is whether or not the types of measurements available are sufficient to distinguish between the disturbance likely to occur in the process. In some cases, the measurements may not be adequate to differentiate between a disturbance that will affect other processes and products and a disturbance which will not. In other cases, the measurements theoretically have enough information to be useful, but in the particular circumstances they may be of such poor quality that they cannot be used. Yet in other instances, real-time process measurements from the tool may be used to identify disturbances.

Along with measurements, an analysis technique is also needed. This analysis needs to be able to take the available measurements and turn them into useful disturbance information. There are any number of techniques available, from expert systems, fuzzy logic, and neural networks to statistical analysis, parameter estimation, and state-space techniques. Depending on the circumstances of the application, any one of these techniques may be appropriate. Whichever technique is used, the analysis must be robust enough to handle errors in the disturbance modeling, and flexible enough to handle new, unmodeled disturbances.

Although using cooperative controllers may still necessitate managing multiple controllers, as in the cases of independent or grouped controllers, there are advantages over non-cooperative controllers. By sharing disturbances information, the controllers are able to reduce or eliminate the switching effect, which can result in fewer test wafers used and fewer off-target lots.

Figure 8:
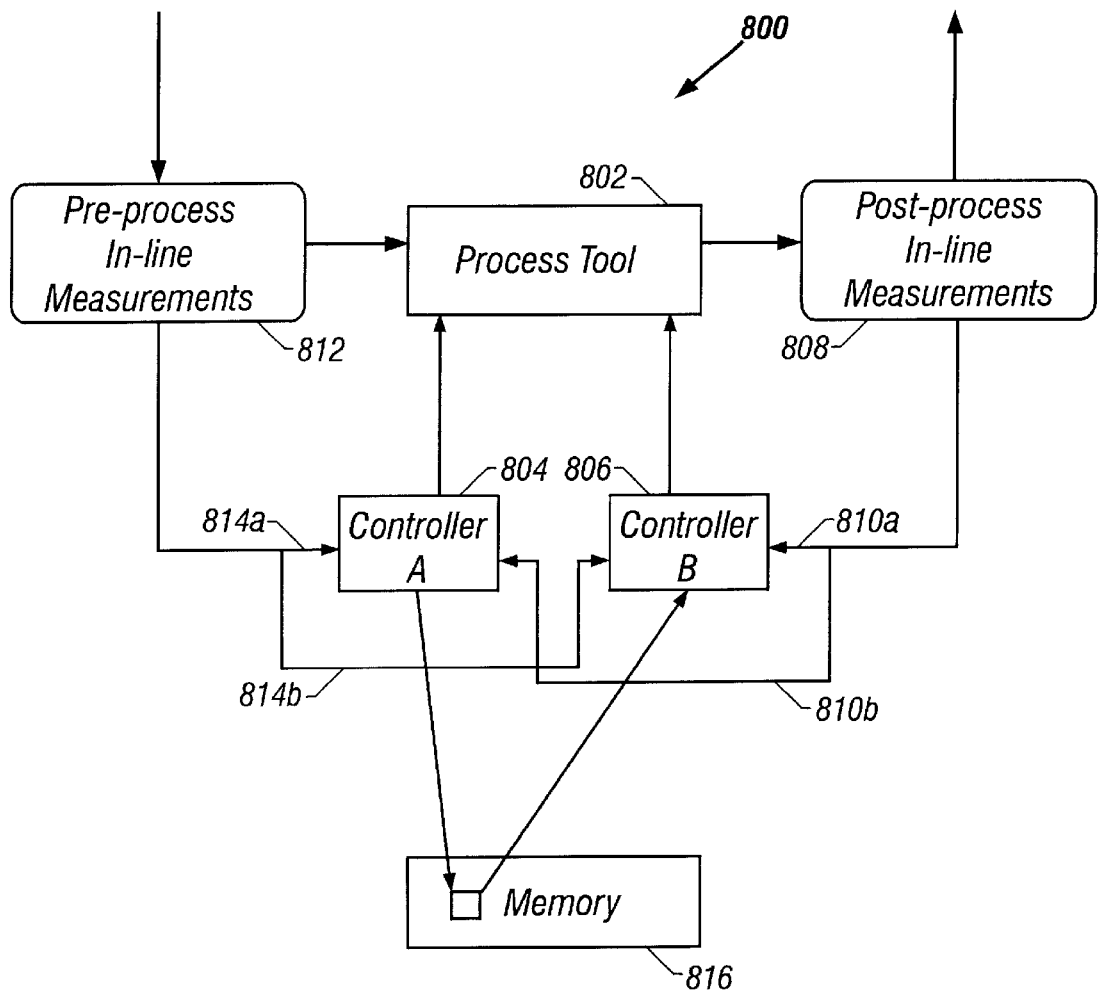
FIG. 8 is a block diagram of a cooperatively controlled semiconductor fabrication environment in accordance with one embodiment of the present invention.

A rudimentary example of cooperative control is illustrated in FIG. 8. FIG. 8 is a block diagram of a cooperatively controlled semiconductor fabrication environment 800 in accordance with one embodiment of the present invention. The process tool 802 receives wafers, carries out the particular process(es) defined for the process tool according to input control parameters received from the controllers 804 and 806, and outputs processed wafers. Post-process in-line measurements are made after execution of the process, as illustrated at block 808. Post-process measurements provide feedback control depicted on feedback (FB) paths 810a and 810b. Alternatively, pre-process in-line measurements, shown at block 812, are made prior to process control. These attributes are provided as feedforward control as shown on feedforward (FF) paths 814a and 814b.

For purposes of example, controller A 804 is assumed to represent a process controller for product A. Controller B 806 is assumed to represent a process controller for product B. Analysis of the pre-process and post-process measurements for product A can reveal disturbance information about the process tool 802. For example, where multiple batches of product A have exhibited a repeated disturbance characteristic (e.g., wafers exiting process tool 802 with out-of-range thickness), controller A 804 concludes that the disturbance can be attributed to the process tool 802. A compensation factor is generated at controller A 804, and preserved for future use by other controllers. In one embodiment, the compensation factor is stored in a memory 816. When product B is subsequently processed by the process tool 802, controller B 806 retrieves the stored compensation factor from the memory 816, so that controller B does not have to independently discover the tool disturbance. In this manner, the compensation factor is "shared" with other controllers, thereby providing cooperative control. It should be recognized that controllers A 804 and B 806 may represent independent or grouped controllers. Furthermore, it should be recognized that this cooperative control system and methodology is applicable where additional controllers are present in the cooperatively controlled semiconductor fabrication environment 800.

Figure 9:
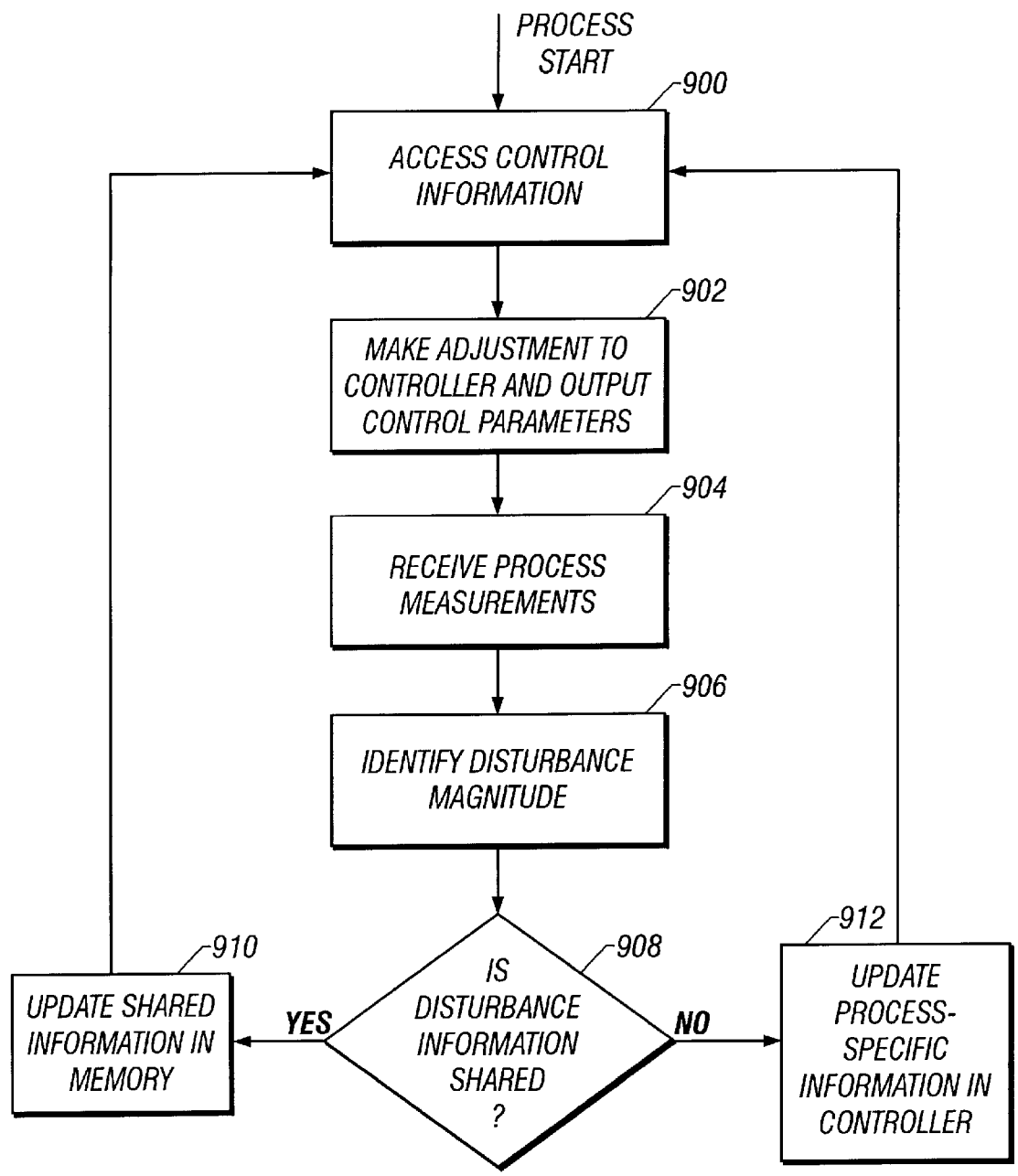
FIG. 9 is a flow diagram illustrating an exemplary cooperative control methodology in accordance with the invention.

FIG. 9 is a flow diagram illustrating an exemplary cooperative control methodology in accordance with the invention. The tool process begins and accesses 900 any available control information. As will be described more fully below, this control information may be in the form of "shared" control information, or "processspecific" control information. During processing, adjustments are made 902 to the controller depending on the control information. The controller receives 904 process measurements, which can represent pre-process and/or post-process measurements, and can represent any attribute associated with a product or process that is capable of being monitored. If, during processing, the controller identifies a disturbance, it identifies 906 the magnitude of the disturbance. At this point it is determined 908 whether the disturbance information is to be shared. If the disturbance is recognized as one to have shared information, the adjustment information is stored 910 in a commonly accessible memory for use by other controllers, which is then accessed by controllers at block 900.

Whether the disturbance is recognized as a tool disturbance at block 908 is process-dependent. Depending on the particular process, certain process/product attributes can be recognized as "global" disturbances (i.e., a disturbance capable of affecting other processes and products). This type of disturbance is typically in the form of a tool disturbance, as a deviant tool characteristic will likely affect all products or processes using that characteristic. An example of such a disturbance in the CMP environment is a deteriorated polish pad that affects the thickness of each of the wafers output by the process tool. A controller can "recognize" such a tool disturbance in a variety of manners. For example, a predetermined proportion of polishing arms in a CMP polish tool that fail to provide the proper wafer output thickness can be assumed to be a disturbance associated with the polish pad. In any event, when the predetermined threshold has been crossed, a compensation factor is generated and stored for use by subsequent controllers.

Where it is determined that the disturbance information is not to be shared with other controllers, the disturbance information is used only to update the process-specific information for that controller. In other words, the controller recognizing the disturbance will make an adjustment for that process, but will not share the disturbance information with other controllers. As previously described, there are instances where disturbance information should not be shared between controllers. For example, if the main disturbance affecting a process is a result of variations in incoming wafer quality, that disturbance information should not be passed on to another controller when a switch in products is made. This is because in most circumstances, incoming quality disturbances by their very nature are less likely to cross products. In these cases, the updated process-specific disturbance information can again be accessed 900 for use by the controller of the particular process, but not by other controllers.

Using the above cooperative control system, control of semiconductor fabrication tooling can be applied in a more logical and efficient manner. The number of independent controllers can be reduced, and throughput is maximized by reducing or eliminating the need to "recalibrate" using test wafers. The number of wafers failing to meet specification is also substantially reduced using the cooperative control methodologies outlined above, because disturbance information is shared with other subsequently initiated controllers.

As noted above, the present invention is applicable to the control of any multi-product or multi-process semiconductor process tool capable of receiving process control parameters. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A method for providing multi-product and multi-process run-to-run control of a semiconductor fabrication tool, comprising:
   generating first control parameters for a process to be performed by the fabrication tool, wherein the first control parameters are based on first tool operation attributes;
   generating second control parameters for the process based on second tool operation attributes; and
   controlling the fabrication tool as a function of the first and second control parameters.

2. The method of claim 1, wherein:
   generating first control parameters comprises analyzing the first tool operation attributes to identify first disturbance information affecting the process; and
   generating second control parameters comprises analyzing the second tool operation attributes to identify second disturbance information affecting the process.

3. The method of claim 2, wherein generating second control parameters comprises generating the second control parameters at least in part as a function of the first disturbance information.

4. The method of claim 3, further comprising storing the first disturbance information for subsequent retrieval and use in generating the second control parameters.

5. The method of claim 2, wherein generating first control parameters comprises generating the first control parameters at least in part as a function of the first disturbance information previously identified in previous generation of the first control parameters.

6. The method of claim 1, further comprising generating a plurality of additional control parameters for a corresponding number of additional processes operating on the semiconductor fabrication tool.

7. The method of claim 6, wherein the additional control parameters are based on additional tool operation attributes of the semiconductor fabrication tool.

8. The method of claim 1, wherein generating first control parameters comprises generating a plurality of first control parameters for a first plurality of processes using a corresponding plurality of independent controllers.

9. The method of claim 8, wherein generating second control parameters comprises generating collective control parameters to collectively control a second plurality of processes using a grouped controller.

10. The method of claim 9, wherein at least one of the second plurality of processes is also one of the first plurality of processes.

11. A method for run-to-run control of multi-product and multi-process run-to-run control of a semiconductor manufacturing tool, comprising:
   individually controlling each of one or more first tool operations based on individual attributes of each of the respective first tool operations;
   collectively controlling each of a plurality of second tool operations with a unitary group controller which provides a common control signal to each of the plurality of second tool operations, wherein the common control signal is based on group attributes common to each of the second tool operations;
   determining disturbance information for each of the first and second tool operations;
   sharing the disturbance information of any one of the first and second tool operations with selected ones of the controlling functions of the first and second tool operations; and
   adjusting the individual and collective control in response to the shared disturbance information.

12. The method of claim 11, wherein determining disturbance information comprises determining tool-based disturbance information affecting multiple operations or multiple products.

13. The method of claim 11, wherein the first and second tool operations comprise processes for performing selected functions of a collective manufacturing operation performed by the semiconductor manufacturing tool.

14. The method of claim 11, wherein the first and second tool operations comprise processes corresponding to differing products having differing characteristics, wherein each of the differing products is processed by one or more of the first and second tool operations.

15. The method of claim 11, wherein individually controlling first tool processes comprises controlling each of the first tool processes with distinct, dedicated controllers.

16. The method of claim 11, further comprising a plurality of the unitary group controllers, wherein each of the unitary group controllers collectively controls a predetermined group of tool processes.

17. The method of claim 11, further comprising identifying the individual attributes that are substantially similar for each of the second tool operations to determine the group attributes.

18. The method of claim 11, wherein sharing the disturbance information comprises storing the disturbance information in a commonly-accessible storage for subsequent retrieval by selected ones of the controlling functions of the first and second tool operations.

19. The method of claim 11, wherein adjusting the individual control comprises modifying individual control parameters generated via the individual control of each of one or more first tool operations.

20. The method of claim 11, wherein adjusting the collective control comprises modifying the common control signal.

* * * * *